(12) United States Patent
Andrews

(10) Patent No.: US 7,442,564 B2
(45) Date of Patent: Oct. 28, 2008

(54) DISPENSED ELECTRICAL INTERCONNECTIONS

(75) Inventor: Peter Andrews, Durham, NC (US)

(73) Assignee: Cree, Inc., Durham, NC (US)

( * ) Notice: Subject to any disclaimer, the term of this patent is extended or adjusted under 35 U.S.C. 154(b) by 225 days.

(21) Appl. No.: 11/334,922

(22) Filed: Jan. 19, 2006

(65) Prior Publication Data

US 2007/0164454 A1 Jul. 19, 2007

(51) Int. Cl.
*H01L 21/00* (2006.01)
(52) U.S. Cl. .................... 438/26; 257/E21.499
(58) Field of Classification Search .......... 257/E21.499, 257/E21.502, E21.503, E21.514
See application file for complete search history.

(56) References Cited

U.S. PATENT DOCUMENTS

| | | | | |
|---|---|---|---|---|
| H208 H | * | 2/1987 | Ng et al. ................. | 257/737 |
| 4,918,497 A | | 4/1990 | Edmond | |
| 4,966,862 A | | 10/1990 | Edmond | |
| 5,027,168 A | | 6/1991 | Edmond | |
| 5,210,051 A | | 5/1993 | Carter, Jr. | |
| 5,338,944 A | | 8/1994 | Edmond et al. | |
| 5,393,993 A | | 2/1995 | Edmond et al. | |
| 5,416,342 A | | 5/1995 | Edmond et al. | |
| 5,523,589 A | | 6/1996 | Edmond et al. | |
| 5,604,135 A | | 2/1997 | Edmond et al. | |
| 5,631,190 A | | 5/1997 | Negley | |
| 5,739,554 A | | 4/1998 | Edmond et al. | |
| 5,912,477 A | | 6/1999 | Negley | |
| 6,120,600 A | | 9/2000 | Edmond et al. | |
| 6,187,606 B1 | | 2/2001 | Edmond et al. | |
| 6,201,600 B1 | | 3/2001 | Sites et al. | |
| 7,208,345 B2 | * | 4/2007 | Meyer et al. ............. | 438/109 |
| 2002/0123164 A1 | | 9/2002 | Slater et al. | |
| 2003/0006418 A1 | | 1/2003 | Emerson et al. | |
| 2004/0056260 A1 | | 3/2004 | Slater et al. | |

OTHER PUBLICATIONS

U.S. Appl. No. 11/336,369, filed Jan. 2006, Andrews.
Thomas Net IndustrialNewsRoom "Archive News Story/Press Release" accessed Dec. 20, 2005; written Mar. 12, 2003; pp. 1-4; <http://news.thomasnet.com/fullstory/20056/1303>.

* cited by examiner

*Primary Examiner*—Scott B Geyer
(74) *Attorney, Agent, or Firm*—Myers Bigel Sibley & Sajovec, P.A.

(57) ABSTRACT

An electronic device includes a substrate, an electrical element on the substrate, a nonconductive adhesive material on the substrate, and a conductive adhesive material on the electrical element and extending onto the nonconductive adhesive material. Methods of forming a packaged LED include providing a substrate having an electrical element thereon, and dispensing a nonconductive adhesive material on the substrate. The nonconductive adhesive material is at least partially cured, and a conductive adhesive material is dispensed on the electrical element and on the at least partially cured nonconductive material. The conductive adhesive material is at least partially cured. The conductive adhesive material may provide an electrical connection between the electrical element and a second electrical element on the substrate or on another substrate.

8 Claims, 4 Drawing Sheets

US 7,442,564 B2

DISPENSED ELECTRICAL INTERCONNECTIONS

FIELD OF THE INVENTION

This invention relates to electronic devices and methods of fabricating electronic devices, and more particularly to interconnections and methods of forming interconnections for electronic devices.

BACKGROUND

Electronic circuits/devices may be formed by mounting electrical components on a substrate, such as a printed circuit board (PCB) or printed wire board (PWB), and interconnecting the electrical components. In addition, it may be desirable to electrically connect two substrates, such as two PCBs and/or two PWBs to permit electrical components on the substrates to operate in a coordinated manner. Interconnection of electrical components on a substrate, and interconnection of substrates, may typically be accomplished using soldered or bonded wires, metal traces, or the like.

Conductive silicone and conductive epoxies have been used as conductive adhesives. For example, conductive silicone has been used to form conductive gaskets for mounting electrical parts, to form electrically conductive sealants, and to provide electrical shielding.

Conductive epoxy has also been used to mount components onto headers. For example, conductive epoxy has been used to mount a light emitting diode (LED) to a metal cup in a package, such as a conventional T-1¾ LED package. Typically, an LED chip includes a substrate, an n-type epitaxial region formed on the substrate and a p-type epitaxial region formed on the n-type epitaxial region (or vice-versa). In order to use an LED chip in a circuit, it is known to enclose an LED chip in a package to provide environmental and/or mechanical protection, color selection, focusing and the like. In a typical LED package, an LED chip is mounted on a reflective cup by means of a solder bond or conductive epoxy. One or more wirebonds connect an ohmic contact of the LED chip to a lead. The entire assembly is then encapsulated in a protective resin, which may be molded in the shape of a lens to collimate the light emitted from the LED chip. Such a package, which may provide a useful point source of light, has been used in numerous applications, such as indicator lights, display elements, and the like.

However, for more complex applications, such as solid state backlighting, it may be desirable to mount an LED chip onto a substrate, such as a PCB/PWB, and to interconnect the LED chip with one or more other electrical elements on the PCB/PWB. Such electrical interconnections may require complex processing that may be difficult to configure and/or may require inflexible designs that may be relatively difficult to modify.

SUMMARY

An electronic device according to some embodiments of the invention includes a substrate, an electrical element on the substrate, a nonconductive adhesive material on the substrate, and a conductive adhesive material on the electrical element and extending onto the nonconductive adhesive material. The electrical element may include an electrical trace.

The electronic device may further include a second electrical element on the substrate. The conductive adhesive material may further extend onto the second electrical element, thereby electrically connecting the electrical element and the second electrical element. The electrical element may include a first electrical trace and the second electrical element may include a second electrical trace.

The electronic device may further include a second substrate, and a third electrical element on the second substrate. The nonconductive adhesive material may extend onto the second substrate, and the conductive adhesive material may extend across the nonconductive adhesive material and onto the third electrical element, thereby electrically connecting the electrical element and the third electrical element. The second substrate may be disposed within a hole in the first substrate and/or the second substrate may be mounted on or adjacent to the first substrate. The first substrate and the second substrate may include metal core printed wire boards and/or printed circuit boards.

The electronic device may further include a fourth electrical element on the substrate, a fifth electrical element on the second substrate, a second nonconductive adhesive material between the substrate and the second substrate, and a second conductive adhesive material extending from the fourth electrical element, across the second nonconductive adhesive material and onto the fifth conductive element, to thereby electrically connect the fourth conductive element and the fifth conductive element.

The electronic device may further include a reflective cup on the substrate defining an optical cavity. The reflective cup may be in contact with the conductive adhesive material and may be electrically connected to the electrical element thereby.

The electronic device may further include a bond pad on the substrate at least partially within the optical cavity defined by the reflective cup, a second electrical element on the substrate and electrically connected to the bond pad, a light emitting device on the bond pad within the optical cavity defined by the reflective cup, and an electrical connection between an electrical contact of the light emitting device and the reflective cup. The nonconductive adhesive material may be at least partially on the second electrical element, and the reflector cup may be isolated from the second electrical element by the nonconductive adhesive material.

Some embodiments of the invention provide methods of forming a packaged electronic device, including providing a substrate having thereon an electrical element, and dispensing a nonconductive adhesive material on the substrate. The nonconductive adhesive material is at least partially cured, and a conductive adhesive material is dispensed on the electrical element and on the at least partially cured nonconductive material. The conductive adhesive material is at least partially cured.

Some methods may further include providing a second electrical element on the substrate, dispensing the conductive adhesive material may include dispensing the conductive adhesive material on the second electrical element. The conductive adhesive material may provide an electrical connection between the electrical element and the second electrical element.

Some methods may further include providing a third electrical element on the substrate. The nonconductive adhesive material may be dispensed at least partially on the third electrical element.

Methods according to some embodiments may further include providing a second substrate adjacent the first substrate, the second substrate having thereon a third electrical element. Dispensing the nonconductive adhesive material may include dispensing the nonconductive adhesive material on an interface between the first substrate and the second substrate. Dispensing the conductive adhesive material may include dispensing the conductive adhesive material on the third electrical element. The conductive adhesive material may provide an electrical connection between the electrical element and the second electrical element.

Methods of forming a packaged electronic device according to some embodiments of the invention include forming a bond pad on a substrate, forming an electrical trace on the substrate and electrically connected to the bond pad, forming a nonconductive adhesive material on the electrical trace, and at least partially curing the nonconductive adhesive material. A conductive adhesive material is dispensed at least partially on the nonconductive adhesive material, and a conductive reflector cup is positioned on the conductive adhesive material defining an optical cavity above the bond pad. The conductive adhesive material is then cured.

Some methods may further include mounting an LED chip on the electrical trace, and forming an electrical connection between the LED chip and the conductive reflector cup.

Further methods may include forming a second electrical trace on the substrate. Dispensing the conductive adhesive material may include dispensing the conductive adhesive material at least partially on the second electrical trace. The conductive adhesive material may provide an electrical connection between the conductive reflector cup and the second electrical trace. Positioning a reflector cup may include dispensing the conductive adhesive material in an annular pattern on the substrate to thereby form a dispensed reflector cup.

Some embodiments of the invention provide a packaged light emitting diode including a substrate, a bondpad on the substrate, a light emitting diode on the bond pad, and an electrical trace on the substrate and connected to the bondpad. A nonconductive adhesive material is on the substrate, and a conductive adhesive material extends across the nonconductive adhesive material.

The packaged light emitting device may further include a reflector cup mounted on the substrate and defining an optical cavity above the bondpad. The conductive adhesive material may be connected to a second trace on the substrate, and the reflector cup may be electrically connected to the second trace by the conductive adhesive material.

The packaged light emitting device may further include a wirebond connection between the reflector cup and the light emitting diode. The conductive adhesive material may form an annular pattern around the bondpad. The nonconductive material may be on the electrical trace and may insulate the conductive adhesive material from the electrical trace.

In some embodiments, the packaged light emitting device may further include a second substrate adjacent the substrate, and a second electrical trace on the second substrate. The nonconductive adhesive material may be at least partially on the second substrate, and the conductive adhesive material may extend onto the second electrical trace, to thereby electrically connect the electrical trace and the second electrical trace.

DETAILED DESCRIPTION OF EMBODIMENTS OF THE INVENTION

Figure 1:
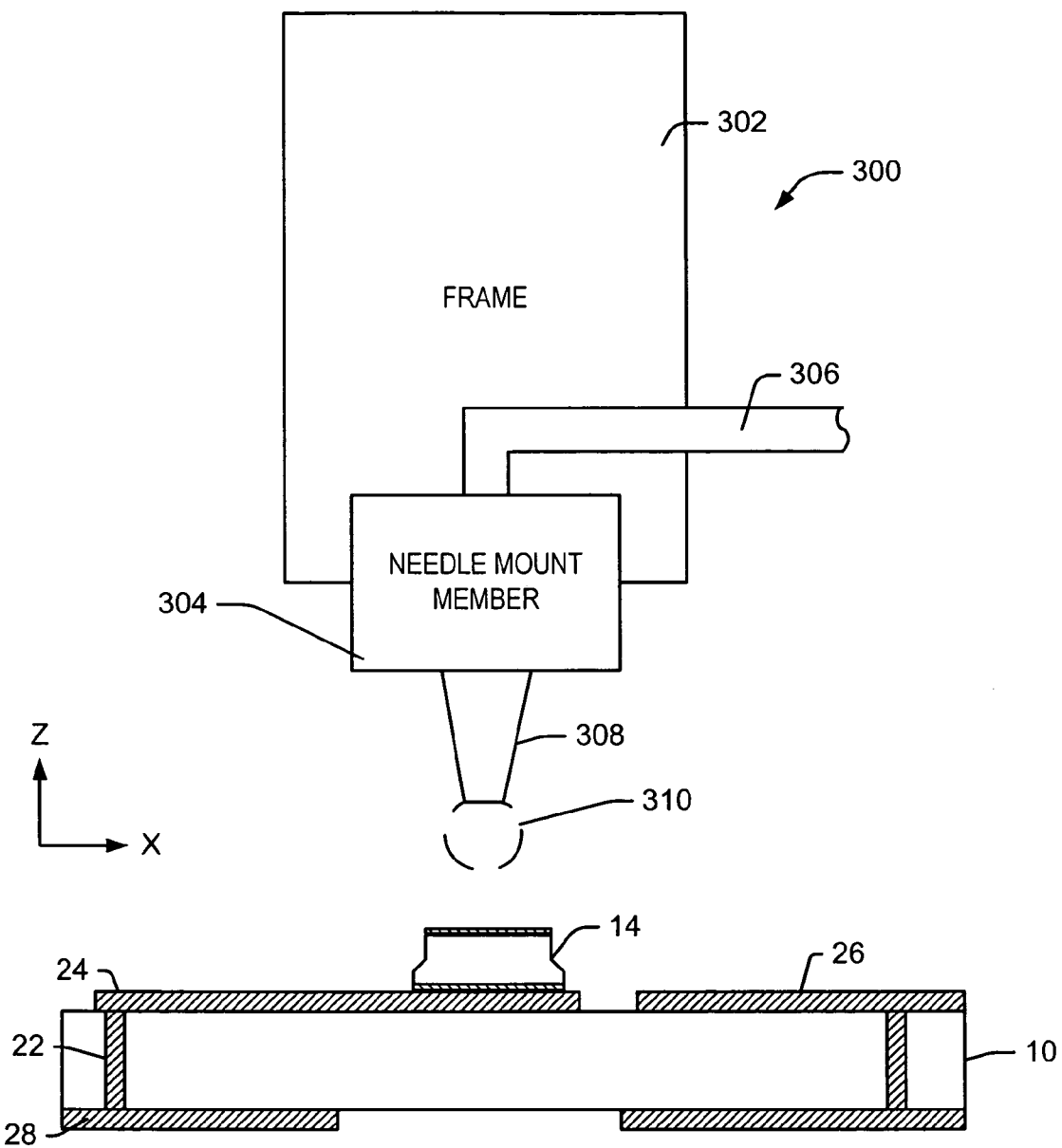
FIG. 1 is a schematic illustration of a system for dispensing a material for use in interconnecting electrical components according to some embodiments of the invention.

The present invention now will be described more fully with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. It will be understood that if part of an element, such as a surface, is referred to as "inner," it is farther from the outside of the device than other parts of the element. Furthermore, relative terms such as "beneath" or "overlies" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional, perspective, and/or plan view illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as a rectangle will, typically, have rounded or curved features due to normal manufacturing tolerances. Thus, the regions illustrated in the figures are schematic in nature and their shapes are not intended to illustrate the precise shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Some embodiments of the present invention relate to packaging of semiconductor light emitting devices. As used herein, the term semiconductor light emitting device may include a light emitting diode, laser diode and/or other semiconductor device which includes one or more semiconductor layers, which may include silicon, silicon carbide, gallium nitride and/or other semiconductor materials. A light emitting device may or may not include a substrate such as a sapphire, silicon, silicon carbide and/or another microelectronic substrates. A light emitting device may include one or more contact layers which may include metal and/or other conductive layers. In some embodiments, ultraviolet, blue and/or green light emitting diodes may be provided. Red and/or amber LEDs may also be provided. The design and fabrication of semiconductor light emitting devices are well known to those having skill in the art and need not be described in detail herein.

For example, the semiconductor light emitting device may be gallium nitride-based LEDs or lasers fabricated on a silicon carbide substrate such as those devices manufactured and sold by Cree, Inc. of Durham, N.C. The present invention may be suitable for use with LEDs and/or lasers as described in U.S. Pat. Nos. 6,201,262; 6,187,606; 6,120,600; 5,912,477; 5,739,554; 5,631,190; 5,604,135; 5,523,589; 5,416,342; 5,393,993; 5,338,944; 5,210,051; 5,027,168; 5,027,168; 4,966,862 and/or 4,918,497, the disclosures of which are incorporated herein by reference as if set forth fully herein. Other suitable LEDs and/or lasers are described in published U.S. Patent Publication No. US 2003/0006418 A1 entitled Group III Nitride Based Light Emitting Diode Structures With a Quantum Well and Superlattice, Group III Nitride Based Quantum Well Structures and Group III Nitride Based Superlattice Structures, published Jan. 9, 2003, as well as published U.S. Patent Publication No. US 2002/0123164 A1 entitled Light Emitting Diodes Including Modifications for Light Extraction and Manufacturing Methods Therefor. Furthermore, phosphor coated LEDs, such as those described in U.S. Patent Publication No. 2004/0056260 A1, entitled Phosphor-Coated Light Emitting Diodes Including Tapered Sidewalls and Fabrication Methods Therefor, the disclosure of which is incorporated by reference herein as if set forth fully, may also be suitable for use in embodiments of the present invention. The LEDs and/or lasers may be configured to operate such that light emission occurs through the substrate. In such embodiments, the substrate may be patterned so as to enhance light output of the devices as is described, for example, in the above-cited U.S. Patent Publication No. US 2002/0123164 A1.

According to some embodiments of the invention, electrical components may be interconnected using a dispensed conductive liquid that may be cured subsequent to dispensing to form a solid electrical interconnection. Thus, the ability to deliver small volumes of fluids accurately may be desirable in the manufacture of electrical devices according to the invention. A variety of different semiconductor fabrication operations utilize precision fluid dispensing with sub-microliter control. For such operations, it may be desirable to provide for accurate, repeatable and/or rapid dispensing of precise amounts of fluids. Inaccurate dispensing may adversely impact the yield of a fabrication process.

According to some embodiments of the invention, a microliter quantity of a material, such as liquid adhesive gel, may dispensed into one or more regions on a substrate. In dispensing the liquid adhesive, a bead of the material is typically formed at the end of a hollow dispensing needle and then contacted to surfaces of the substrate and/or an electrical component, such as an electrical trace, a chip, or other elements provided thereon. When the needle is withdrawn, surface tension between the dispensed liquid and surfaces on which the bead is contacted may, with the aid of gravity, cause the encapsulant material to tear off from the dispensing needle and remain on the substrate.

In some embodiments, the liquid may be dispensed in a desired pattern, for example, a circular pattern, by moving the needle in a horizontal motion after contacting the bead to the surface of the substrate. In this manner, the desired pattern may be "drawn" onto the substrate with the needle. Additional liquid may be dispensed through the dispensing needle as the pattern is being "drawn" onto the substrate. In other embodiments, the liquid may be dispensed at one location on the substrate, and may flow to other locations on the substrate.

A system 300 for dispensing an encapsulant material according to some embodiments of the invention is illustrated in FIG. 1. The system 300 includes a frame 302, which may be attached to an articulated arm (not shown) configured to controllably move the frame 302 in the X, Y, and Z dimensions. (The X and Z dimensions are indicated in FIG. 1. The Y dimension is perpendicular to both the X and Z dimensions, and conceptually extends into and out of the plane of FIG. 1.) A needle mount member 304 is mounted on the frame 302, and an encapsulant supply line 306 is coupled to the needle mount member 304 for supplying a quantity of encapsulant material to a hollow dispensing needle 308 mounted on the needle mount member 304. A bead of encapsulant 310 may be formed at the tip of the dispensing needle 308.

As discussed above, the bead of liquid 310 may be dispensed onto a top surface of substrate 10 on which a pair of metal traces 24, 26 are formed. The metal traces 24, 26 may include, for example, gold, tin, copper, or other metals. The substrate 10 may further include one or more conductive vias 22 extending therethrough and connecting one or more of the front side metal traces 24, 26 to a back side trace 28. An LED chip 14 may be mounted on a conductive trace 24 or a bond pad (not shown) electrically connected to the conductive trace 24. The liquid 310 may be dispensed by contacting the bead of liquid 310 to a surface of the substrate 10 and/or the LED chip 14. In some embodiments, the shape of the dispensed adhesive material may be controlled by moving the frame 302 in the X, Y and/or Z dimensions as the liquid is being dispensed. For example, the liquid may be effectively dispensed into an annular region by moving the frame in a circular pattern after contacting the bead 310 to a surface of the substrate 10 within the annular region.

The viscosity and/or other properties of the dispensed material may be selected such that wetting may occur without bubble formation. In some embodiments of the present invention, coatings may be applied to surfaces contacted by the dispensed material to speed/retard the wetting rate. For example, using known cleaning procedures that leave microscopic residue, selected surfaces may be treated and, thus, used to engineer the dynamics of the wetting action.

In order to form a conductive pattern, the dispensed liquid may include a conductive material, such as a conductive dye, conductive liquid silicone, conductive silver epoxy, and/or any other dispensable conductive liquid. An example of a conductive liquid silicone is Dow Corning HV 1520/40 which is available from Dow Corning Corporation and which features a high tear strength, high electrical conductivity and fast cure speed.

Figure 2:
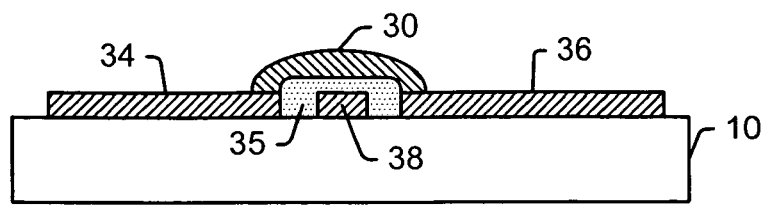
FIG. 2 is a cross-sectional view illustrating an electrical device according to some embodiments of the invention.

Some embodiments of the invention are illustrated in FIG. 2, which shows a substrate 10, which may include, for example, a printed circuit board (PCB) on which one or more circuit elements may be mounted. In particular, a substrate 10 may include a metal core PCB (MCPCB) including a metal core having thereon a polymer and/or other insulating coating on which first and second patterned metal traces 34, 36 may be formed. MCPCB material, and material similar thereto, is commercially available from, for example, The Bergquist Company. The PCB may further include heavy clad (4 oz. copper or more) and/or conventional FR-4 PCB material with thermal vias. MCPCB material may provide improved thermal performance compared to conventional dielectric PCB material. However, MCPCB material may also be heavier than conventional PCB material which may not include a metal core. The substrate may additionally or alternatively include an aluminum block, an alumina, aluminum nitride or silicon wafer, or other suitable material.

The first and second electrical traces 34, 36 may be formed on a surface of the substrate 10, for example, by conventional metal patterning processes. It may be desirable to interconnect the two metal traces across an intervening conductive element, such as electrical element 38. The electrical element 38 may include an electrical trace, an electrical component, a bond pad, and/or any other type of electrical element having one or more conductive features/surfaces.

According to some embodiments of the invention, a nonconductive material 35 is dispensed above the electrical element 38 in the region between the first electrical trace 34 and the second electrical trace 36. The nonconductive material 35 may include an insulating material such as a silicone or other epoxy that may be dispensed/cured on the substrate 10. It will be appreciated that while the nonconductive material 35 may extend across the electrical element 38, it may not completely cover the substrate 10 between the first electrical trace 34 and the electrical element 38 and/or between the second electrical trace 36 and the electrical element 38, provided that the surface of the substrate 10 between the first and second electrical traces 34, 36 is non-conductive. If any portion of the region between the first and second electrical traces 34, 36 is conductive, the nonconductive material 35 may extend across the conductive region. If the substrate 10 is conductive, the nonconductive material 35 may extend completely between the first electrical trace 34 and the second electrical trace 36.

After dispensing, the nonconductive material 35 may be at least partially cured, for example, by heating the material 35 for a suitable period of time at a suitable temperature, by allowing the dispensed material to sit for a suitable period of time at room temperature, by exposure to UV light, with the aid of a catalyst, and/or by other suitable techniques. Curing can be performed in one step and/or multiple steps.

After at least partially curing the nonconductive material 35, a conductive material 30 is dispensed on the substrate such that it extends at least partially on the first electrical trace 34, across the nonconductive material 35 and onto the second electrical trace 36. The conductive material 30 may then be at least partially cured, causing the conductive material 30 to at least partially solidify. The conductive material 30 may thereby provide an electrical connection between the first electrical trace 34 and the second electrical trace 36. In some embodiments, the nonconductive material 35 may not be cured, or partially cured, before dispensing the conductive material 30. Rather, the conductive material 30 may be dispensed onto uncured nonconductive material 35.

Figure 3A:
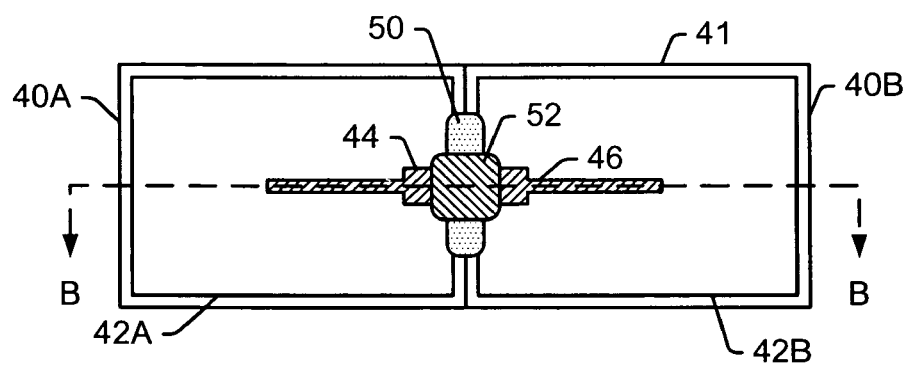
FIG. 3A is a top view illustrating an electrical device according to some embodiments of the invention including two interconnected substrates.
Figure 3B:
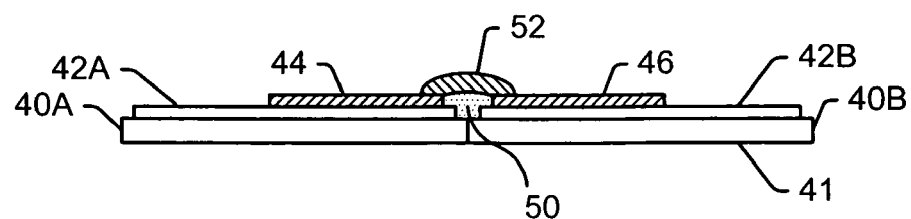
FIG. 3B is a cross sectional view of the electrical device of FIG. 3A.

Further embodiments of the invention are illustrated in FIGS. 3A and 3B. FIG. 3A is a top view illustrating an electrical device 41 according to some embodiments of the invention, and FIG. 3B is a cross sectional view taken along line B-B of the electrical device 41 of FIG. 3A. In some cases it may be desirable to interconnect two substrates, such as substrates 40A and 40B shown in FIGS. 3A and 3B, such that the substrates may function as a unified device 41. The substrates 40A, 40B shown in FIGS. 3A and 3B may, for example, be tiles of a backlight unit, that may be connected, for example, with one another and/or with other tiles in order to form a two-dimensional solid state backlighting panel for a display, such as an LCD display. It may be desirable to electrically interconnect the tiles so that light emitters mounted on the tiles may be energized simultaneously, for example.

As with the substrate 10 illustrated in FIG. 2, the substrates 40A, 40B may include a PCB, PWB or other substrate. In some embodiments, the substrates 40A, 40B may include metal core PCB (MCPCB) substrates on which an insulating film 42A, 42B is formed. First and second metal traces 44, 46 may be formed on the substrates 40A, 40B. More specifically, the first and second metal traces 44, 46 may be formed on the insulating films 42A, 42B.

The metal traces 44, 46 may be connected to electrical components and/or devices mounted on the substrates 40A, 40B. Because the substrates may include conductive metal cores, it may be desirable to substantially prevent the electrical traces 44, 46 from making direct contact with the substrate cores. Thus, when two substrates 40A, 40B are to be joined, and the electrical traces 44, 46 thereon interconnected, it may be desirable to dispense a quantity of nonconducting material 50 in the region between the electrical traces 44, 46 of the substrates 40A, 40B, to at least cover/isolate exposed edges of the substrates 40A, 40B. The nonconducting material 50 may additionally provide mechanical stability/support to the connection between the substrates 40A, 40B.

As discussed above, the nonconducting material 50 may include a silicone or other epoxy. After dispensing, the nonconductive material 50 may be at least partially cured, and a conductive material 52 may be dispensed on the substrates 40A, 40B such that it extends at least partially on the first electrical trace 44, across the nonconductive material 50 and onto the second electrical trace 46. The conductive material 52 may then be at least partially cured, causing the conductive material 52 to at least partially solidify. The conductive material may thereby provide an electrical connection between the first electrical trace 44 on one substrate 40A and the second electrical trace 46 on an adjacent substrate 40B.

Figure 4A:
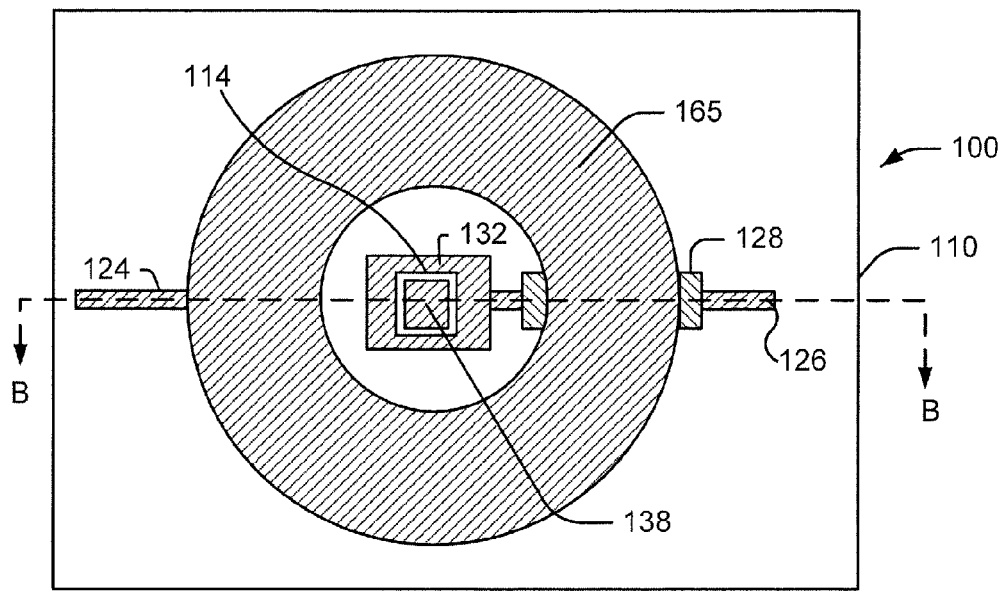
FIG. 4A is a top view illustrating a packaged LED according to some embodiments of the invention.
Figure 4B:
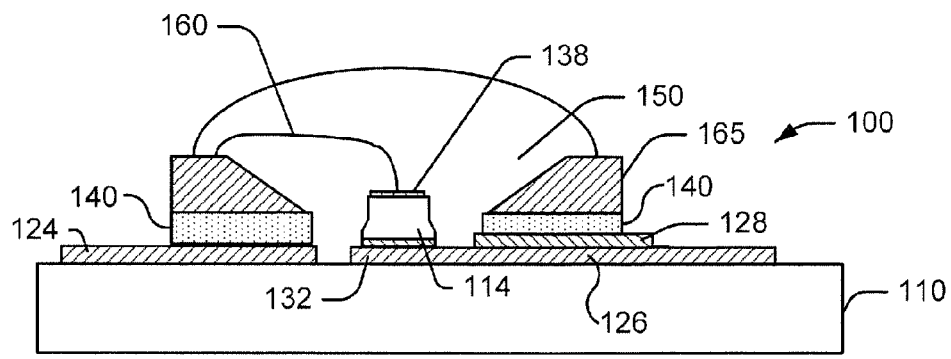
FIG. 4B is a cross-sectional view of the packaged LED of FIG. 4A.

Further embodiments of the invention are illustrated in FIGS. 4A and 4B. FIG. 4A is a top view illustrating a packaged light emitting device 100 according to some embodiments of the invention, and FIG. 4B is a cross sectional view taken along line B-B of the light emitting device 100 of FIG. 4A. As shown therein, a substrate 110 includes thereon a first electrical trace 124 and a second electrical trace 126. The substrate 110 may include a PCB, PWB, or MCPCB. The substrate 110 may additionally or alternatively include an aluminum or copper block, a wafer of alumina, aluminum nitride, silicon, silicon carbide, gallium arsenide, or other suitable conductive, nonconductive and/or semiconductor material.

An LED chip 114 may be mounted on a bond pad 132, which is connected to, or part of, the second electrical trace 126. The LED chip 114 may be mounted on the bond pad 132, for example by thermosonic or thermocompressive bonding or by soldering. A nonconductive adhesive material 128 is formed on a portion of the second electrical trace 126. The nonconductive adhesive material 128 may be formed, for example, by dispensing a quantity of nonconductive liquid silicone on the substrate 10 in a desired pattern and at least partially curing the nonconductive liquid silicone as described above.

A conductive adhesive material 140 is dispensed on the substrate. For example, the conductive adhesive material 140 may be dispensed in an annular pattern on the substrate 110 around the LED chip 114, or at one or more discrete locations on the substrate 110, at least one location being on the first electrical trace 124. A conductive reflector cup 165 may be positioned on the conductive adhesive material 140 such that it defines an optical cavity above the bond pad 132/LED chip 114. The LED chip 114 may be mounted onto the bond pad 132 before or after the reflective cup is affixed to the substrate 110. When cured, the conductive adhesive material 140 may provide both a mechanical connection of the reflector cup 165 to the substrate 110 as well as an electrical connection between the reflector cup 165 and the first electrical trace 124.

The reflector cup 165 may include a metal part or a molded plastic part that is embedded/coated with reflective/conductive material. Alternatively, the reflector cup 165 may be formed by dispensing/curing an encapsulant material. Fabrication of reflectors by dispensing/curing of encapsulant materials is described, for example, in copending U.S. patent application Ser. No. 11/336,369, entitled "PACKAGES FOR SEMICONDUCTOR LIGHT EMITTING DEVICES UTILIZING DISPENSED REFLECTORS AND METHODS OF FORMING THE SAME" filed concurrently herewith and assigned to the assignee of the present invention, the disclosure of which is hereby incorporated herein by reference as if fully set forth herein. In particular, the conductive material dispensed to form the reflector cup 165 may include a conductive silicone gel impregnated with a reflective substance. For example, the silicone gel may be impregnated with silver chrome metal flakes, such as a 2 mil×2 mil paint powder, for reflectivity. Alternatively or additionally, the silicone gel may include $TiO_2$ or $SiO_2$ particles having, for example, an average radius less than 1 μm embedded therein for reflectivity. Such particles are commonly used to provide reflectivity for reflective paints.

A wirebond connection 160 may be made between a contact 138 of the LED chip 114 and the reflector cup 165, thereby providing an electrical connection between the contact 138 and the first electrical trace 124 through the reflector cup 165 and the conductive adhesive 140. Since the wirebond connection 160 may be made to the reflector cup 165, it may not be necessary to provide a separate wirebond pad on the substrate 110 within the reflector cup 165. Thus, the diameter of the reflector cup 165 may be made smaller, thereby improving the optical source size. This may be an important benefit for optical devices, since having a smaller reflector cup may permit the device to better approximate an ideal point source of light, thereby potentially making the design of secondary optics easier.

If the reflector cup 165 is formed as a dispensed feature, a metal trace (not shown) may be formed on the reflector cup 165, and the wirebond connection may be made to the metal trace.

After the reflector cup 165 is mounted and the conductive adhesive 140 is at least partially cured, a clear encapsulant material 150 may be dispensed above the reflector cup 165 to fill the optical cavity above the LED chip 114.

The encapsulant material 150, or a portion of it, may include a wavelength conversion material, such as a phosphor and/or a nanocrystal, therein to convert a wavelength of light emitted by the LED chip 114 to a second wavelength. Additionally or alternatively, the encapsulant material 150 may include an optical scattering material.

Figure 4C:
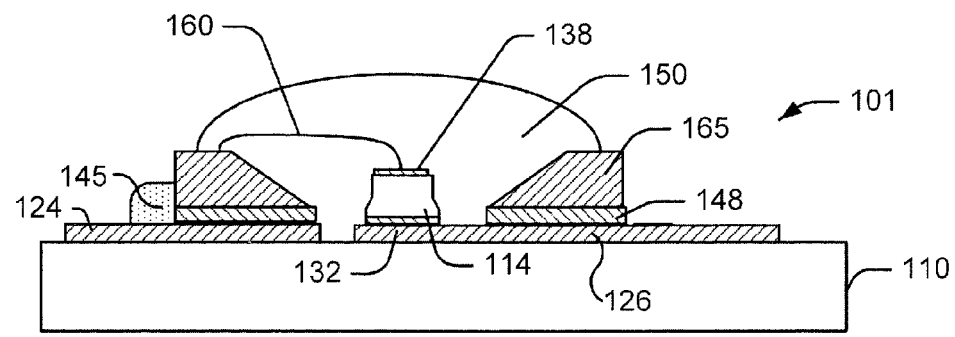
FIG. 4C is a cross-sectional view of a packaged LED according to further embodiments of the invention.

FIG. 4C is a cross sectional illustration of a packaged LED 101 according to further embodiments of the invention. In the packaged LED 101, a nonconductive adhesive material 148 is dispensed on the substrate 110 for example in an annular pattern around the bond pad 132, and the reflector cup 165 is positioned on the nonconductive adhesive material 148. A quantity of conductive adhesive material 145 may be dispensed at or near the corner of the reflector cup 165 and the first electrical trace 124, so that the conductive adhesive material 145 contacts both the reflector cup 165 and the first electrical trace 124, and provides an electrical connection therebetween. In this manner, a mechanical connection between the reflector cup 165 and the substrate 110 may be provided using the nonconductive adhesive material 148, while the electrical connection between the reflector cup 165 and the first electrical trace 124 may be provided by the conductive adhesive material 145.

Figure 5:
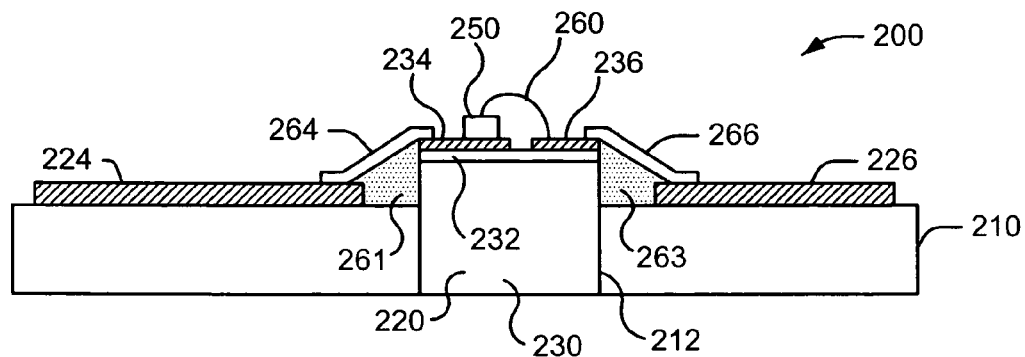
FIG. 5 is a cross-sectional view illustrating a packaged LED according to some embodiments of the invention.

Further embodiments of the invention are illustrated in FIG. 5. As shown therein, a packaged light emitting device may include a substrate 210, which in some embodiments may include an FR-4 PCB, on/in which is mounted an LED subassembly 220. In some embodiments, the LED subassembly 220 may be positioned within a hole 212 that extends at least partially through the substrate 210, which may provide some benefits for heat dissipation. However, in other embodiments, the LED subassembly 220 may simply be mounted on the substrate 210.

The LED subassembly 220 may include a substrate 230 on which an insulating film 232 is formed. The substrate 230 may include, for example, an MCPCB. Alternatively or additionally, the substrate 230 may include aluminum, copper, alumina, silicon, silicon carbide, gallium arsenide, or another suitable material. First and second electrical traces 234, 236 may be formed on the insulating film 232, and at least one LED 250 may be mounted on at least one of the electrical traces, for example the first electrical trace 234. A wirebond connection 260 may be made from the LED 250 to the second electrical trace 236.

Third and fourth electrical traces 224, 226 may be provided on the substrate 210. A first nonconductive material 261 may be dispensed between the LED subassembly 220 and the substrate 210 on a side of the LED assembly 220 adjacent the first electrical trace 234, and a second nonconductive material 263 may be dispensed between the LED subassembly 220 and the substrate 210 on a side of the LED assembly 220 adjacent the second electrical trace 236. The first and second nonconductive materials 261, 263 may be at least partially cured. The first and second nonconductive materials 261, 263 may affix the LED subassembly 220 to the substrate 210 and/or may provide additional mechanical stability and/or support for the LED subassembly 220.

After the first and second nonconductive materials 261, 263 are at least partially cured, a first conductive material 264 may be dispensed above the first nonconductive material 261 to electrically connect the first electrical trace 234 and the third electrical trace 224, and a second conductive material 266 may be dispensed above the second nonconductive material 263 to electrically connect the second electrical trace 236 and the fourth electrical trace 226. The first and second conductive materials 264, 266 may then be partially and/or fully cured.

Figure 6:
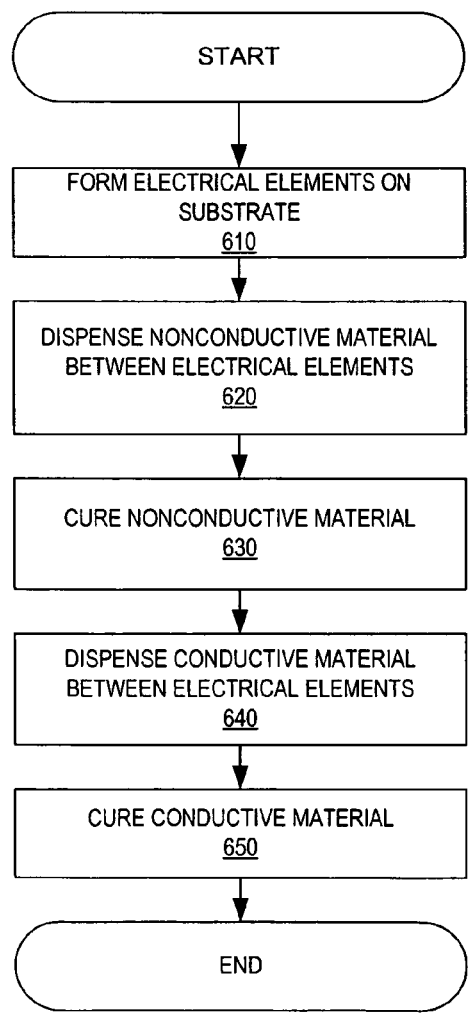
FIG. 6 is a flowchart illustrating operations according to some embodiments of the invention.

Operations according to some embodiments of the invention are illustrated in FIG. 6. As illustrated therein, electrical elements are formed on a substrate (block 610). The electrical elements may include, for example, conductive traces, electrical components, electrical contacts and/or other electronic features. The substrate may include a PCB, PWB, or MCPCB substrate, or another suitable material, such as aluminum, copper, alumina, silicon, silicon carbide, gallium arsenide, and the like. A nonconductive liquid adhesive material is dispensed between the electrical elements (block 620). The nonconductive liquid adhesive may include, for example, a curable silicone gel. The nonconductive liquid adhesive may be dispensed over a conductive element, such as a conductive trace, electronic component, or a conductive edge/surface of a substrate, that is disposed between the electrical elements.

The nonconductive adhesive liquid is at least partially cured (block 630) by heating the material for a suitable period of time at a suitable temperature, by allowing the dispensed material to sit for a suitable period of time at room temperature, by exposure to UV light, with the aid of a catalyst, and/or by other suitable techniques. Curing can be performed in one step and/or multiple steps.

A conductive liquid adhesive is then dispensed between the electrical elements (block 640). The conductive liquid adhesive may extend from across the cured nonconductive material and at least partially onto each of the electrical elements. The conductive liquid adhesive may include, for example, a conductive liquid silicone adhesive. The conductive liquid adhesive is then cured (block 650), causing it to harden and form an electrical connection between the electrical elements.

It will be appreciated that the term "adhesive" refers to the property of one material to stick, or adhere, to another, and that a material need not be used to mechanically join two articles in order to be considered an "adhesive."

Some embodiments of the present invention may provide packages for light emitting devices with reflector cups that are relatively small compared to conventional reflector cups. Thus, the optical source provided by such a package may better approximate an ideal point source of light, which may make the design of secondary optics easier when using packages according to embodiments of the invention.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A method of forming a packaged electronic device, comprising:
    dispensing a liquid nonconductive adhesive material on a substrate having thereon an electrical element;
    at least partially curing the liquid nonconductive adhesive material;
    dispensing a liquid conductive adhesive material on the electrical element and on the at least partially cured nonconductive material; and
    at least partially curing the liquid conductive adhesive material.

2. A method of forming a packaged electronic device, comprising:
    dispensing a nonconductive adhesive material on a substrate having thereon an electrical element;
    at least partially curing the nonconductive adhesive material;
    dispensing a conductive adhesive material on the electrical element and on the at least partially cured nonconductive material;
    at least partially curing the conductive adhesive material; and
    providing a second electrical element on the substrate;
    wherein dispensing the conductive adhesive material comprises dispensing the conductive adhesive material on the second electrical element; and
    wherein the conductive adhesive material provides an electrical connection between the electrical element and the second electrical element.

3. The method of claim 2, further comprising:
    providing a third electrical element on the substrate;
    wherein dispensing the nonconductive adhesive material comprises dispensing the nonconductive adhesive material at least partially on the third electrical element.

4. A method of forming a packaged electronic device, comprising:
    dispensing a nonconductive adhesive material on a substrate having thereon an electrical element;
    at least partially curing the nonconductive adhesive material;
    dispensing a conductive adhesive material on the electrical element and on the at least partially cured nonconductive material;
    at least partially curing the conductive adhesive material; and
    providing a second substrate adjacent the first substrate, the second substrate having thereon a second electrical element;
    wherein dispensing the nonconductive adhesive material comprises dispensing the nonconductive adhesive material on an interface between the first substrate and the second substrate;
    wherein dispensing the conductive adhesive material comprises dispensing the conductive adhesive material on the second electrical element; and
    wherein the conductive adhesive material provides an electrical connection between the electrical element and the second electrical element.

5. A method of forming a packaged electronic device, comprising:
    forming a bond pad on a substrate;
    forming an electrical trace on the substrate, the electrical trace being electrically coupled to the bond pad;
    forming a nonconductive adhesive material on the electrical trace;
    at least partially curing the nonconductive adhesive material;
    dispensing a conductive adhesive material at least partially on the nonconductive adhesive material;
    positioning a conductive reflector cup on the conductive adhesive material, the reflector cup defining an optical cavity above the bond pad; and curing the conductive adhesive material.

6. The method of claim 5, further comprising:
mounting an LED chip on the bond pad; and
forming an electrical connection between the LED chip and the conductive reflector cup.

7. The method of claim 6, further comprising:
forming a second electrical trace on the substrate;
wherein dispensing the conductive adhesive material comprises dispensing the conductive adhesive material at least partially on the second electrical trace; and
wherein the conductive adhesive material provides an electrical connection between the conductive reflector cup and the second electrical trace.

8. The method of claim 5, wherein positioning a reflector cup comprises dispensing the conductive adhesive material in an annular pattern on the substrate to thereby form a dispensed reflector cup.

* * * * *

UNITED STATES PATENT AND TRADEMARK OFFICE
CERTIFICATE OF CORRECTION

PATENT NO. : 7,442,564 B2  
APPLICATION NO. : 11/334922  
DATED : October 28, 2008  
INVENTOR(S) : Andrews Page 1 of 1

It is certified that error appears in the above-identified patent and that said Letters Patent is hereby corrected as shown below:

On the Title Page:

Item 56, References Cited, U.S. Patent Documents:  
Please correct "6,201,600   3/2001   Sites et al."  
    To read -- 6,120,600   9/2000   Edmond et al. --

Signed and Sealed this

Thirtieth Day of December, 2008

JON W. DUDAS  
*Director of the United States Patent and Trademark Office*